United States Patent [19]
Jorke et al.

[11] Patent Number: 4,857,972
[45] Date of Patent: Aug. 15, 1989

[54] IMPATT DIODE

[75] Inventors: Helmut Jorke, Gerstetten; Johann-Friedrich Luy, Ulm, both of Fed. Rep. of Germany

[73] Assignee: Licentia Patent-Verwaltungs-GmbH, Frankfurt am Main, Fed. Rep. of Germany

[21] Appl. No.: 105,952

[22] Filed: Sep. 28, 1987

[30] Foreign Application Priority Data

Sep. 27, 1986 [DE] Fed. Rep. of Germany ....... 3632921
Jul. 30, 1987 [DE] Fed. Rep. of Germany ....... 3725214

[51] Int. Cl.$^4$ .................. H01L 27/12; H01L 45/00; H01L 29/90; H01L 29/161
[52] U.S. Cl. .......................................... 357/4; 357/13; 357/16
[58] Field of Search .................. 357/4, 13, 16

[56] References Cited

U.S. PATENT DOCUMENTS

| | | | |
|---|---|---|---|
| 3,466,512 | 9/1969 | Seidel | 357/16 |
| 4,176,366 | 11/1979 | Delagebeaudeuf | 357/16 |
| 4,257,055 | 3/1981 | Hess et al. | 357/4 |
| 4,291,320 | 9/1981 | Wen et al. | 357/13 |
| 4,529,455 | 7/1985 | Bean et al. | 148/175 |

FOREIGN PATENT DOCUMENTS 2225842 11/1974 France .

OTHER PUBLICATIONS

Summers et al., "Variably Spaced Superlattice Energy Filter, a New Device Design Concept for High-Energy Electron Injection", Appl. Phys. Lett., vol. 48, No. 12, Mar. 24, 1986.

Kesan et al., "The Influence of Transit-Time Effects on the Optimum Design and Maximum Oscillation Frequency of Quantum Well Oscillators", IEEE Transactions on Electron Devices, vol. 35, No. 4, Apr. 1988.

"Measurement of the Band Gap of GexSil-X/Si Strained-Layer Heterostructures", Applied Physics Letters, vol. 47, No. 12, Dec., 1985, pp. 1333-1335.

"Indirect Band Gap of Conerently Strained GexSil-x Bulk Alloys on §001° Silicon Substrates", R. People, Physical Review, vol. 32, No. 2, Jul. 15, 1985.

"Novel Devices by Si-Based Molecular Beam Epitaxy", Wang, Solid State Technology, vol. 28, No. 10, Oct. 1985.

"Low-Frequency Noise of Ion-Implanted Double-Drift Impatt Diodes", D. H. Lee, Proceedings of the IEEE, vol. 6, No. 5, pp. 666-667, May, 1973.

Primary Examiner—Eugene R. LaRoche
Assistant Examiner—Michael B. Shingleton
Attorney, Agent, or Firm—Spencer & Frank

[57] ABSTRACT

An IMPATT diode having Si-SiGe heterostructure grown on a Si substrate with the SiGe layer being disposed in the generation zone of the IMPATT diode. The SiGe layer may be replaced by a Si/SiGe superlattice.

17 Claims, 2 Drawing Sheets

IMPATT DIODE

BACKGROUND OF THE INVENTION

The present invention relates to an IMPATT (Impact Avalanche Transit Time) diode composed of a monocrystalline silicon substrate to which a heterostructure-semiconductor layer sequence has been applied in an alternating arrangement of at least two different semiconductor layers forming at least one heterojunction.

IMPATT diodes are powerful millimeter wavelength components. They are utilized, in particular, to generate oscillations.

Avalanche multiplication by impact ionization and movement of the charge carriers through a drift space together may produce a negative resistance. A structure suitable to generate and combine these mechanisms is, for example, a pn-junction.

By using a heterojunction instead of a pn-junction, the voltage required for the avalanche breakdown of the IMPATT diode can be reduced. The heterostructure of the IMPATT diode must be such that the semiconductor material of the generation zone (avalanche breakdown zone) has a smaller band gap than the material of the drift zone. This reduces the ionization threshold energy and thus increases the efficiency of the IMPATT diode.

However, prior art solutions have the drawback that the semiconductor materials employed place the efficiency of the IMPATT diode, for example for a frequency of 80 GHz, at below 10%, and limit the wavelength range to the millimeter range. Moreover, the use of economical Si substrates is possible only within limits.

SUMMARY OF THE INVENTION

It is therefore an object of the invention to provide an IMPATT diode having a heterostructure which can be produced economically, has high efficiency and whose wavelength range includes the millimeter and submillimeter ranges.

The above object is achieved according to the present invention in that in an IMPATT diode composed of a monocrystalline Si substrate to which a heterostructure semiconductor sequence has been applied in an alternating arrangement of at least two different semiconductor layers forming at least one heterojunction, the generation zone of the IMPATT diode includes at least one SiGe layer.

According to one embodiment of the invention the substrate is formed of $p^+$-Si, and the heterostructure semiconductor layer sequence includes an undoped SiGe layer, an n-doped Si layer and an $n^+$-doped Si layer grown on the substrate.

According to another embodiment of the invention, the heterostructure semiconductor layer sequence grown on the $p^+$-Si substrate is composed of a p-doped Si layer, an undoped SiGe layer, an n-doped Si layer, and an $n^+$-doped Si layer.

According to further embodiments of the invention, the generation zone of the IMPATT diode is configured such that the undoped SiGe layer of each of the two embodiments mentioned above is replaced with an undoped Si/SiGe superlattice.

According to a feature of the invention, a predeterminable stress distribution is produced in the heterostructure semiconductor layer sequence to result in a reduction of the band gap of the semiconductor materials forming the generation zone.

The invention has the advantage that the IMPATT diode is manufactured on a cost efficient Si substrate and its efficiency is improved by a suitable Si/SiGe heterostructure.

The invention will be described in greater detail below for embodiments thereof and with reference to the schematic drawings.

DETAILED DESCRIPTION OF THE PREFERRED EMBODIMENT

Figure 1:
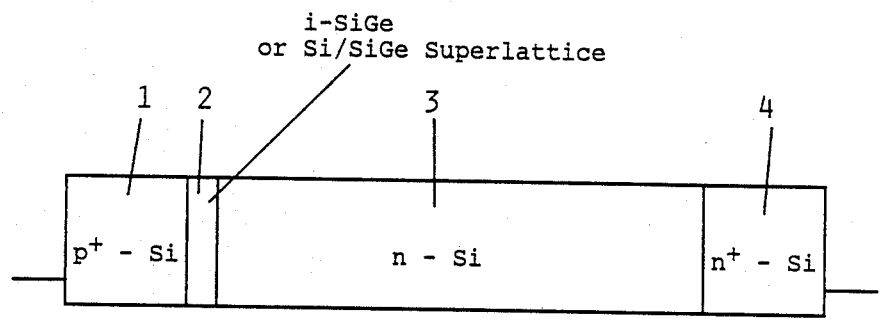
FIG. 1 is a schematic illustration of the structure of a single heterostructure IMPATT diode according to the invention.

Referring now to FIG. 1, there is shown an IMPATT diode according to the invention including a $p^+$-doped Si substrate 1 having a charge carrier concentration of more than $10^{19} cm^{-3}$, on which there is applied a semiconductor layer sequence composed of:

an undoped, i.e., intrinsic, SiGe layer 2 having a layer thickness of about 0.02 $\mu m$;

an n-doped Si layer 3 having a charge carrier concentration of about $1.4 \cdot 10^{17} cm^{-3}$ and a layer thickness of about 0.3 $\mu m$; and an $n^+$-doped Si layer having a charge carrier concentration of about $5 \cdot 10^{19} cm^{-3}$ and a layer thickness of about 0.1 $\mu m$.

The symbol "+" indicates heavy doping. Suitable doping materials for silicon are, for example, Sb, P, and As for n-type doping, and B, Ga, Al and In for p-type doping.

In operation, a reverse voltage of such magnitude that the space charge layer extends over semiconductor layers 2 and 3 is applied to the structure of FIG. 1. At the boundary between the $p^+$-doped Si substrate 1 and the SiGe layer 2, the maximum field intensity is so great that impact ionization begins.

The semiconductor layer structure of an IMPATT diode according to FIG. 1 differs from that of an IMPATT diode based on Si and provided with a pn-junction in that a SiGe layer 2 has been grown at the location where the field intensity necessary for impact ionization, and thus avalanche multiplication, occurs. Advantageously, SiGe has a smaller band gap $E_g$ than Si ($E_g=1.12$ eV) and thus a lower ionization threshold energy than Si. For an $Si_{0.6}Ge_{0.4}$ layer of a thickness of 0.02 $\mu m$, the band gap $E_g = 0.76$ eV.

Additionally, the different lattice constants of Si and SiGe produce a lateral mechanical tension in the semiconductor layers. If, for example, an $Si_{0.6}Ge_{0.4}$ layer 2 having a subcritical layer thickness of about 0.02 $\mu m$ is precipitated onto an Si substrate 1, a lateral pressure stress develops in the SiGe layer since the natural lattice constant of monocrystalline SiGe is greater than that of monocrystalline Si. A layer thickness is considered subcritical if the layers composed of different semiconductor materials have the same lattice constant in the lateral direction. This then indicates pseudomorphous growth. The pressure stress causes the SiGe layer to be compacted by up to 4%. The mechanical stress created by the pseudomorphic growth results in a reduction of the band gap of SiGe and results in an additional reduction of the ionization threshold energy of SiGe.

Figure 2:
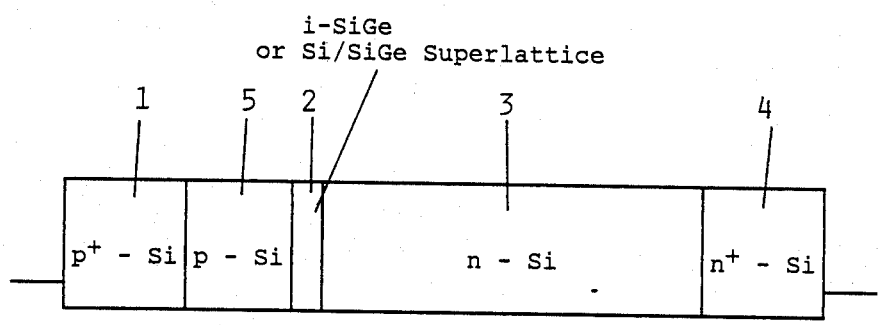
FIG. 2 is a schematic illustration of the structure of a double heterostructure IMPATT diode according to the invention.

The embodiment according to FIG. 2 shows an IMPATT diode having a double heterostructure. The double heterostructure of FIG. 2 differs, for example, from the single heterostructure of FIG. 1 by a further p-doped Si layer 5 grown between the p+-doped substrate 1 and the undoped SiGe layer 2. Si layer 5 has a layer thickness of about 0.25 μm and a positive charge carrier concentration of about $1.6 \cdot 10^{17}$ cm$^{-3}$. With respect to layer thickness and layer composition, substrate 1 and semiconductor layers 2, 3, 4 are selected analogously to the corresponding layer of the structure shown in FIG. 1. The mechanical stress in the SiGe layer 2 caused by the different lattice constants of Si and SiGe advantageously results in a reduction of the band gap in the SiGe layer and a reduction in the ionization threshold energy.

The greater ionization rate of SiGe has the advantage that the spatial region in which power loss occurs is reduced and the efficiency of the IMPATT diode is augmented. The efficiency of heterostructure IMPATT diodes according to the present invention, for a frequency of 100 GHz, lies between 12 and 15%.

Figure 3:
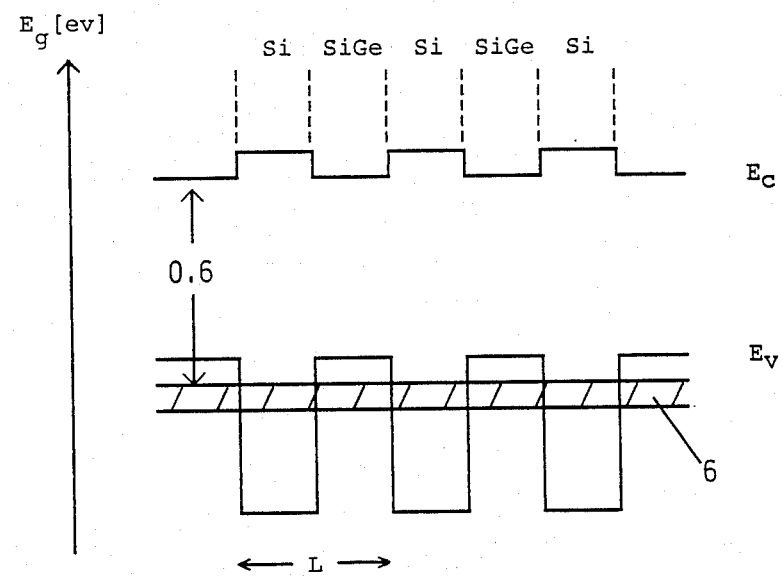
FIG. 3 shows the energy band scheme for an $Si/Si_{0.2}Ge_{0.8}$ superlattice for an IMPATT diode according to the invention.

To increase the efficiency of the IMPATT diode of this type, it is additionally of advantage to configure the generation zone as an undoped Si/SiGe superlattice. In a Si/SiGe superlattice having a suitable period duration, the Ge percentage x in the $Si_{1-x}Ge_x$ layers of the superlattice can be selected to be greater, if the layer thickness is the same as for an individual SiGe layer, than in a corresponding individual $Si_{1-x}Ge_x$ layer. By increasing the Ge percentage x of the $Si_{1-x}Ge_x$ layers and optimally configuring the period duration of the Si/SiGe superlattice, it is possible, as shown in FIG. 3, to produce a miniband 6 in the energy band scheme of the Si/SiGe superlattice whose band gap toward the conduction band $E_c$ is smaller than the band gap between the valence and conduction bands of an individual SiGe layer having the same layer thickness. For example, for an individual $Si_{1-x}Ge_x$ layer having a layer thickness of 0.02 μm, the maximum Ge percentage x=0.4, and the corresponding band gap $E_g=0.76$ eV. For a symmetrical $Si/Si_{1-x}Ge_x$ superlattice having a layer thickness of 0.02 μm and being composed of five periods, only three of which are shown in FIG. 3, and with each period having a period duration L=0.004 μm, the maximum Ge percentage x=0.8 and the corresponding band gap $E_g=0.6$ eV. In a symmetrical superlattice, all individual layers of the superlattice have the same layer thickness.

The critical layer thickness of the $Si/Si_{1-x}Ge_x$ superlattice is greater, with the identical Ge percentage x, than in an individual $Si_{1-x}Ge_x$ layer. Thus, the layer thickness of the generation zone can be selected to be greater if a Si/SiGe superlattice is employed than for an individual SiGe layer. This has the advantage that the superlattice IMPATT diode can be used over a broader frequency range than the corresponding heterostructure IMPATT diode which includes only a single SiGe layer.

The wavelength range of the IMPATT diodes according to the invention covers the millimeter and submillimeter ranges.

The heterostructure semiconductor layer sequences of the IMPATT diodes according to the invention are produced, in a known manner, by means of a molecular beam epitaxy process.

The present invention is not limited to the stated p+inn+ or p+pinn+ structure of the IMPATT diodes, but can also be used for inverse structures which are produced in that, in the embodiments, the conductivity types of the semiconductor layers are reversed (n-type conductivity is replaced by p-type conductivity and vice versa). Moreover, the present invention is not only suitable for IMPATT diodes with quasi-Read structures as described but, moreover, can also be applied for Misawa diodes.

It will be understood that the above description of the present invention is susceptible to various modifications, changes and adaptations, and the same are intended to be comprehended within the meaning and range of equivalents of the appended claims.

What is claimed is:

1. In an IMPATT diode comprising a monocrystalline Si substrate layer to which a heterostructure semiconductor layer sequence has been applied and includes an alternating arrangement of at least two different semiconductor material layers forming at least one heterojunction to provide a generation zone within said layer sequence; the improvement wherein: said substrate layer is a heavily doped substrate layer of one conductivity type; said heterostructure semiconductor layer sequence is grown on said substrate layer and includes, in sequence, an undoped SiGe layer in said generation zone, a doped Si layer of a second conductivity type opposite said one conductivity type, and a heavily doped Si layer of said second conductivity type; said substrate has a charge carrier concentration of more than $10^{19}$ cm$^{-3}$; said doped Si layer has a charge carrier concentration of about $1.4 \times 10^{17}$ cm$^{-3}$; and said heavily doped Si layer has a charge carrier concentration of about $5 \times 10^{19}$ cm$^{-3}$.

2. An IMPATT diode as defined in claim 1 wherein said one conductivity type is p-type conductivity.

3. An IMPATT diode as defined in claim 1 wherein: said undoped SiGe layer has a layer thickness of about 0.02 μm; said doped Si layer has a layer thickness of about 0.3 μm; and said heavily doped Si layer has a layer thickness of about 0.1 μm.

4. An IMPATT diode as defined in claim 3 wherein said one conductivity type is n-type.

5. In an IMPATT diode comprising a monocrystalline Si substrate layer to which a heterostructure semiconductor layer sequence has been applied and includes an alternating arrangement of at least two different semiconductor material layers forming at least one heterojunction to provide a generation zone within said layer sequence; the improvement wherein: said substrate layer is a heavily doped substrate layer of one conductivity type; and said heterostructure semiconductor layer sequence is grown on said substrate layer and includes, in sequence, a doped Si layer of said one conductivity type disposed on said substrate, an undoped SiGe layer in said generation zone, a doped Si layer of a second conductivity type opposite said one conductivity type, and a heavily doped Si layer of said second conductivity type.

6. An IMPATT diode as defined in claim 5, wherein said one conductivity type is p-type conductivity.

7. An IMPATT diode as defined in claim 5, wherein: said substrate has a charge carrier concentration of more than $10^{19}$ cm$^{-3}$; said doped Si layer of said one conductivity type has a charge carrier concentration of about $1.6\times10^{17}$cm$^{-3}$; said doped Si layer of the second conductivity type has a charge carrier concentration of about $1.4\times10^{17}$ cm$^{-3}$; and said heavily doped Si layer has a charge carrier concentration of about $5\times10^{19}$ cm$^{-3}$.

8. An IMPATT diode as defined in claim 7 wherein said doped Si layer of said one conductivity type has a layer thickness of about 0.25 μm; said undoped SiGe layer has a layer thickness of about 0.02 μm; said doped Si layer of said second conductivity type has a layer thickness of about 0.3 μm; and said heavily doped Si layer has a layer thickness of about 0.1 μm.

9. An IMPATT diode as defined in claim 8 wherein said one conductivity type is p-type.

10. In an IMPATT diode comprising a monocrystalline Si substrate layer to which a heterostructure semiconductor layer sequence has been applied and includes an alternating arrangement of at least two different semiconductor material layers forming at least one heterojunction to provide a generation zone within said layer sequence; the improvement wherein: said substrate layer is a heavily doped substrate layer of one conductivity type; said heterostructure semiconductor layer sequence is grown on said substrate layer and includes, in sequence, an undoped Si/SiGe superlattice in said generation zone, a doped Si layer of a second conductivity type opposite said one conductivity type, and a heavily doped Si layer of said second conductivity type; said undoped Si/SiGe superlattice has a thickness of about 0.02 μm; said doped Si layer has a layer thickness of about 0.3 μm; and said heavily doped Si layer has a layer thickness of about 0.1 μm.

11. An IMPATT diode as defined in claim 10 wherein: said substrate has a charge carrier concentration of more than $10^{19}$ cm$^{-3}$; said doped Si layer has a charge carrier concentration of about $1.4\times10^{17}$ cm$^{-3}$ and said heavily doped Si layer has a charge carrier concentration of about $5\times10^{19}$cm$^{-3}$.

12. In an IMPATT diode comprising a monocrystalline Si substrate layer to which a heterostructure semiconductor layer sequence has been applied and includes an alternating arrangement of at least two different semiconductor material layers forming at least one heterojunction to provide a generation zone within said layer sequence; the improvement wherein: said substrate layer is a heavily doped substrate layer of one conductivity type; said heterostructure semiconductor layer sequence is grown on said substrate layer and includes, in sequence, an undoped Si/SiGe superlattice in said generation zone, a doped Si layer of a second conductivity type opposite said one conductivity type, and a heavily doped Si layer of said second conductivity type; and said undoped Si/SiGe superlattice is a symmetrical superlattice.

13. In an IMPATT diode comprising a monocrystalline Si substrate layer to which a heterostructure semiconductor layer sequence has been applied and includes an alternating arrangement of at least two different semiconductor material layers forming at least one heterojunction to provide a generation zone within said layer sequence; the improvement wherein: said substrate layer is a heavily doped substrate layer of one conductivity type; and said heterostructure semiconductor layer sequence is grown on said substrate layer and includes, in sequence, a doped Si layer of said one conductivity type disposed on said substrate, an undoped Si/SiGe superlattice in said generation zone, a doped Si layer of a second conductivity type opposite said one conductivity type, and a heavily doped Si layer of said second conductivity type.

14. An IMPATT diode as defined in claim 13 wherein said doped Si layer of said one conductivity type has a layer thickness of about 0.25 μm; said undoped Si/SiGe superlattice has a thickness of about 0.02 μm; said doped Si layer of said second conductivity type has a layer thickness of about 0.3 μm; and said heavily doped Si layer has a layer thickness of about 0.1 μm.

15. An IMPATT diode as defined in claim 14 wherein: said substrate has a charge carrier concentration of more than $10^{19}$cm$^{-3}$; said doped Si layer of said one conductivity type has a charge carrier concentration of about $1.6\times10^{17}$cm$^{-3}$; said doped Si layer of said second conductivity type has a charge carrier concentration of about $1.4\times10^{17}$; and said heavily doped Si layer has a charge carrier concentration of about $5\times10^{19}$ cm$^{-3}$.

16. In an IMPATT diode comprising a monocrystalline Si substrate layer to which a heterostructure semiconductor layer sequence has been applied and includes an alternating arrangement of at least two different semiconductor material layers forming at least one heterojunction to provide a generation zone within said layer sequence; the improvement wherein: said substrate layer is a heavily doped substrate layer of one conductivity type; said heterostructure semiconductor layer sequence is grown on said substrate layer and includes, in sequence, an undoped SiGe layer in said generation zone, a doped Si layer of a second conductivity type opposite said one conductivity type, and a heavily doped Si layer of said second conductivity type: and the thickness of said SiGe layer is subcritical for the composition of said SiGe layer and is selected so as to produce a predeterminable stress distribution in said heterostructure semiconductor layer sequence to result in a reduction of the band gap of said SiGe layer.

17. An IMPATT diode as defined in claim 12 wherein the thickness of said Si/SiGe superlattice is subcritical for the composition of the selected SiGe material and is selected so as to produce a predeterminable stress distribution in said heterostructure semiconductor layer sequence to result in a reduction of the band gap of the semiconductor materials forming the generation zone of the diode.

* * * * *